(12) United States Patent
Funabashi

(10) Patent No.: US 10,348,288 B2
(45) Date of Patent: Jul. 9, 2019

(54) DIFFERENTIAL OUTPUT CIRCUIT

(71) Applicant: Panasonic Intellectual Property Management Co., Ltd., Osaka (JP)

(72) Inventor: Masami Funabashi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/574,307

(22) PCT Filed: May 18, 2016

(86) PCT No.: PCT/JP2016/002420
§ 371 (c)(1),
(2) Date: Nov. 15, 2017

(87) PCT Pub. No.: WO2016/185716
PCT Pub. Date: Nov. 24, 2016

(65) Prior Publication Data
US 2018/0131363 A1 May 10, 2018

(30) Foreign Application Priority Data
May 20, 2015 (JP) ................. 2015-103062

(51) Int. Cl.
*H03B 1/00* (2006.01)
*H03K 3/00* (2006.01)
(Continued)

(52) U.S. Cl.
CPC ... *H03K 17/08122* (2013.01); *H01L 27/0928* (2013.01); *H03F 3/195* (2013.01);
(Continued)

(58) Field of Classification Search
CPC ....... H03K 17/08122; H03K 17/04123; H03K 2217/0036; H03K 19/0944;
(Continued)

(56) References Cited

U.S. PATENT DOCUMENTS

| 2011/0074465 A1* | 3/2011 | Chiba | H03K 19/003 |
| | | | 326/83 |
| 2014/0062595 A1* | 3/2014 | Mitsuishi | H03F 1/523 |
| | | | 330/253 |
| 2015/0355664 A1 | 12/2015 | Mitsuishi et al. | |

FOREIGN PATENT DOCUMENTS

| JP | 2012-238929 A | 12/2012 |
| JP | 2012238929 A * | 12/2012 |

(Continued)

OTHER PUBLICATIONS

International Search Report issued in Application No. PCT/JP2016/002420 dated Aug. 9, 2016, with English translation.

*Primary Examiner* — Metasebia T Retebo
(74) *Attorney, Agent, or Firm* — McDermott Will & Emery LLP

(57) ABSTRACT

A differential output circuit includes: input transistors that receive differential input signals; n stages of cascode transistors ($n \geq 2$) cascode connected to the input transistors; output terminals connected to the drains of n-th stage cascode transistors; an intermediate potential generating circuit that supplies an intermediate potential of potentials of the output terminals to the gates of the n-th stage cascode transistors; and a dividing circuit that supplies divided potentials resulting from the intermediate potential being divided into (n−1) stages to the respective gates of the (n−1)-th through first stages of the cascode transistors in descending order of potential.

10 Claims, 10 Drawing Sheets

(51) Int. Cl.
*H03K 17/0812* (2006.01)
*H01L 27/092* (2006.01)
*H03K 17/0412* (2006.01)
*H03F 3/195* (2006.01)
*H03F 3/45* (2006.01)
*H03K 19/0175* (2006.01)
*H03K 19/0185* (2006.01)
*H03K 19/0944* (2006.01)
*H01L 21/8238* (2006.01)

(52) U.S. Cl.
CPC ..... *H03F 3/45188* (2013.01); *H03F 3/45677* (2013.01); *H03K 17/04123* (2013.01); *H01L 21/823892* (2013.01); *H03K 19/0175* (2013.01); *H03K 19/0185* (2013.01); *H03K 19/0944* (2013.01); *H03K 2217/0036* (2013.01)

(58) Field of Classification Search
CPC ............ H03K 19/0185; H03K 19/0175; H03F 3/45677; H03F 3/195; H03F 3/45188; H01L 27/0928; H01L 21/823892
USPC ......................................................... 327/108
See application file for complete search history.

(56) References Cited

FOREIGN PATENT DOCUMENTS

| | | | |
|---|---|---|---|
| JP | 5385711 | B2 | 1/2014 |
| JP | 2014-050087 | A | 3/2014 |
| WO | 2011/004513 | A1 | 1/2011 |

* cited by examiner

FIG. 4C
| VDD | NPD (L: POWERED-DOWN) (H: NORMAL OPERATION) | CONTROLLER OUTPUT | Rb1 RESISTANCE |
|---|---|---|---|
| 1.8 V | L | H | Rb70//Rb71 |
| 1.8 V | H | L | Rb70 |
| 0 V | L | H | Rb70//Rb71 |
| 0 V | H | H | Rb70//Rb71 |
FIG. 4D
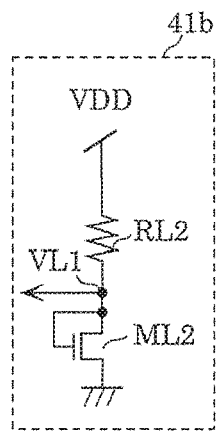
FIG. 4E
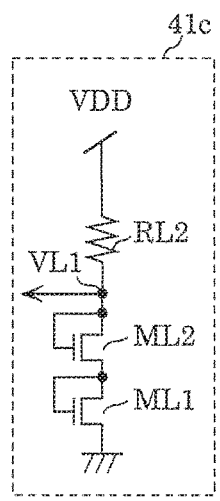

DIFFERENTIAL OUTPUT CIRCUIT

RELATED APPLICATIONS

This application is the U.S. National Phase under 35 U.S.C. § 371 of International Application No. PCT/JP2016/002420, filed on May 18, 2016, which in turn claims the benefit of Japanese Application No. 2015-103062, filed on May 20, 2015, the disclosures of which are incorporated by reference herein.

TECHNICAL FIELD

The present invention relates to differential output circuits.

BACKGROUND ART

In recent years, there has been an increase in the demand for an increase in data communication speed and low power consumption circuitry between electronic devices. Using low-voltage transistors, which are advantageous for their switching speed and power consumption characteristics, in data communications circuitry disposed between electronic devices is effective in meeting this demand.

For example, a differential output circuit used as an output buffer for, for example, the High-Definition Multimedia Interface (R) (HDMI), is an open drain circuit, and has a configuration in which a termination voltage of 3.3V is applied from an external source. When low-voltage transistors are applied to differential output circuits that conventionally use high-voltage transistors, problems arise with overvoltage reliability.

Patent Literature (PTL) 1 discloses a data communications circuit having a configuration in which cascode transistors are connected to differential input pair transistor drains. The drain voltage from one of the cascode transistors is supplied to the gate of the other cascode transistor. This cascode transistor connection configuration reduces the potential difference between the terminals of each transistor. This makes it possible to increase durability with respect to overvoltage, even when low-voltage transistors are used in a data communications circuit of which high-voltage is demanded. Moreover, since the bias voltage that is supplied to the gate of a cascode transistor is supplied from an output terminal, an appropriate bias voltage is supplied even if the voltage in the differential output circuit is lower than the output terminal voltage, and the low-voltage transistors are protected from overvoltage.

CITATION LIST

Patent Literature

PTL 1: Japanese Patent No. 5385711

SUMMARY OF THE INVENTION

Technical Problems

However, with the data communications circuit disclosed in PTL 1, cascode transistor gates are connected to output terminals which operate dynamically. Accordingly, the parasitic capacitance (gate input capacitance) of the cascode transistor accounts for part of the load capacitance of the differential output circuit, thereby further hindering an increase in circuit operation speed. Moreover, since the cascode transistor is single-stage, when it is applied in a circuit that requires a higher voltage, the durability of the transistor with respect to overvoltage is insufficient. Further, when a lower power supply voltage, lower low-voltage transistor is used so as to achieve high operational speed and low power consumption, transistor overvoltage durability is insufficient, thereby making it difficult to provide a highly reliable circuit.

The present invention was conceived to overcome the above-described problems, and has an object to provide a differential output circuit that uses low-voltage transistors and has high-voltage characteristics, high-speed characteristics, and low power consumption.

Solution to Problems

In order to overcome the above-described problems, a differential output circuit according to one aspect of the present disclosure includes: a first input transistor and a second input transistor that receive respective differential input signals, the respective differential input signals having mutually inverted phases; and n stages of first cascode transistors (n being a natural number greater than or equal to 2) cascode connected to the first input transistor and n stages of second cascode transistors cascode connected to the second input transistor. When the first cascode transistor connected to a drain of the first input transistor is a first stage first cascode transistor, the first cascode transistor connected farthest from the first input transistor is an n-th stage first cascode transistor, the second cascode transistor connected to a drain of the second input transistor is a first stage second cascode transistor, and the second cascode transistor connected farthest from the second input transistor is an n-th stage second cascode transistor, with respect to each of the n stages, a gate of a k-th stage of the first cascode transistors ($1 \leq k \leq n$) and a gate of a k-th stage of the second cascode transistors are connected. The differential output circuit further includes: a first output terminal connected to a drain of the n-th stage first cascode transistor; a second output terminal connected to a drain of the n-th stage second cascode transistor; an intermediate potential generating circuit that supplies an intermediate potential of a potential of the first output terminal and a potential of the second output terminal to a gate of the n-th stage first cascode transistor and a gate of the n-th stage second cascode transistor; and a dividing circuit that supplies divided potentials resulting from the intermediate potential being divided into (n−1) stages to respective gates of (n−1)-th through first stages of the first cascode transistors in descending order of potential.

Advantageous Effect of Invention

With the differential output circuit according to this disclosure, it is possible to provide a differential output circuit that uses low-voltage transistors and has high-voltage characteristics, high-speed characteristics, and low power consumption.

BRIEF DESCRIPTION OF DRAWINGS

FIG. 4C is a state transmission diagram of a variable resistance unit according to Embodiment 2.

FIG. 4D illustrates a configuration of a power supply voltage detector according to Variation 1 of Embodiment 2.

FIG. 4E illustrates a configuration of a power supply voltage detector according to Variation 2 of Embodiment 2.

DESCRIPTION OF EXEMPLARY EMBODIMENTS

Hereinafter, a differential output circuit according to embodiments of the present disclosure will be described with reference to the drawings. Note that the following embodiments are specific examples of the present invention; the numerical values, shapes, materials, elements, the arrangement and connection of the elements, steps, the order of the steps, etc., are mere examples, and therefore do not limit the present invention.

Embodiment 1

(1-1. Circuit Configuration of Differential Output Circuit Including n Stages of Cascode Transistors)

Figure 1:
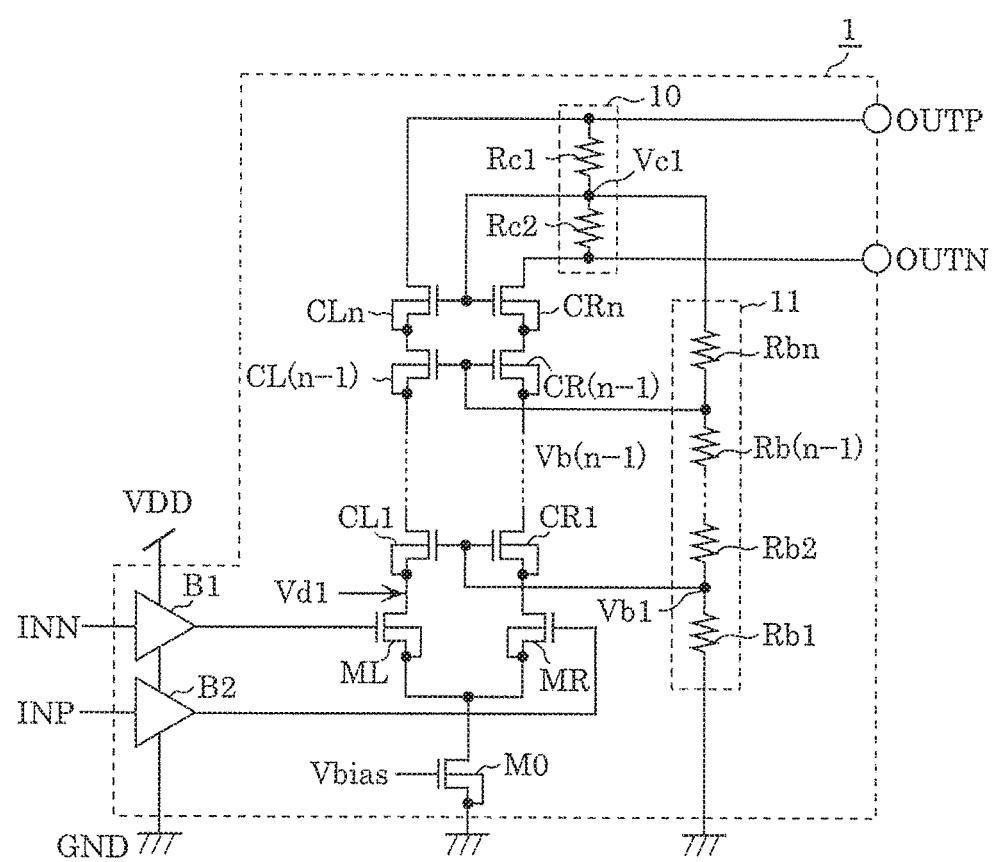
FIG. 1 illustrates a circuit configuration of a differential output circuit including n stages of cascode transistors according to Embodiment 1.

FIG. 1 illustrates the circuit configuration of differential output circuit 1 including n stages of cascode transistors according to Embodiment 1. In the same figure, differential output circuit 1 includes buffers B1 and B2, current source transistor M0, input transistors ML and MR, n cascode transistors CLk (1≤k≤n; n is a natural number greater than or equal to 2), n cascode transistors CRk (1≤k≤n), intermediate potential generating circuit 10, dividing circuit 11, and output terminals OUTP and OUTN.

Buffers B1 and B2 operate on power supply voltage VDD, and respectively buffer and supply input signals INN and INP to the gates of input transistors ML and MR. Here, input signals INN and INP have mutually inverted phases.

Note that buffer B1 is a first buffer and buffer B2 is a second buffer.

Current source transistor M0 is, for example, an NMOS transistor, and functions as a current source of the current that flows through the input transistors and cascode transistors in response to a bias voltage Vbias being applied to the gate of current source transistor M0.

Input transistors ML and MR are, for example, NMOS transistors. The sources of input transistors ML and MR are connected to each other and to the drain of current source transistor M0. Input transistors ML and MR are differential pair transistors.

Note that input transistor ML is a first input transistor and input transistor MR is a second input transistor.

Cascode transistors CL1 and CR1 are, for example, NMOS transistors, and are cascode connected to input transistors ML and MR, respectively. In other words, the source of cascode transistor CL1 is connected to the drain of input transistor ML, the source of cascode transistor CR1 is connected to the drain of input transistor MR, and the gates of cascode transistors CL1 and CR1 are connected together. Cascode transistors CL1 and CR1 form a first cascode transistor pair that is cascode connected to input transistors ML and MR.

Moreover, the source of cascode transistor CL2 is connected to the drain of cascode transistor CL1, the source of cascode transistor CR2 is connected to the drain of cascode transistor CR1, and the gates of cascode transistors CL2 and CR2 are connected together. Cascode transistors CL2 and CR2 are, for example, NMOS transistors, and form a second cascode transistor pair that is cascode connected to cascode transistors CL1 and CR1.

Moreover, the source of cascode transistor CLn is connected to the drain of cascode transistor CL(n−1), the source of cascode transistor CRn is connected to the drain of cascode transistor CR(n−1), and the gates of cascode transistors CLn and CRn are connected together. Moreover, the drain of cascode transistor CLn is connected to output terminal OUTP, and the drain of cascode transistor CRn is connected to output terminal OUTN. Cascode transistors CLn and CRn are, for example, NMOS transistors, and form an n-th cascode transistor pair that is cascode connected to cascode transistors CL(n−1) and CR(n−1).

Note that each cascode transistor CL1 through CLn is a first cascode transistor, and each cascode transistor CR1 through CRn is a second cascode transistor.

Intermediate potential generating circuit 10 includes resistors Rc1 and Rc2, and resistors Rc1 and Rc2, which are connected in series, are connected between output terminals OUTP and OUTN. Moreover, a connection node of resistors Rc1 and Rc2 is connected to the gates of cascode transistors CLn and CRn. With this configuration, intermediate potential generating circuit 10 generates intermediate potential Vc1 of the voltage of output terminal OUTP and the voltage of output terminal OUTN, and applies intermediate potential Vc1 to the gates of cascode transistors CLn and CRn.

Note that output terminal OUTP is a first output terminal and output terminal OUTN is a second output terminal.

Dividing circuit 11 includes n resistors Rbk (1≤k≤n; n is a natural number greater than or equal to 2), and the n resistors Rbk, which are connected in series, are connected between (i) the connection node of resistors Rc1 and Rc2 and (ii) a GND terminal. Moreover, a connection node of resistors Rbk and Rb(k+1) is connected to the gates of cascode transistors CLk and CRk. With this configuration, dividing circuit 11 generates divided potentials Vb(n−1) through Vb1 by dividing intermediate potential Vc1, and supplies divided potentials Vb(n−1) through Vb1 to the respective gates of cascode transistors CL(n−1) and CR(n−1) through the respective gates of cascode transistors CL1 and CR1 in descending order of potential.

In the above-described configuration of differential output circuit 1, the minimum required stages—$N_{min}$ stages—of cascode transistors is expressed in Equation 1 below.

$$N_{min}=(V_{OUTP}-Vd1)/Vp \quad \text{(Equation 1)}$$

Here, $V_{OUTP}$ is the maximum output potential of output terminal, Vd1 is the drain potential of input transistor ML, and Vp is the breakdown voltage of each transistor.

For example, when $V_{OUTP}$=3.6V, Vd1=1.5V, VP=1.9V, $N_{min}$≈1.1. Accordingly, as long as there are two or more stages of cascode transistors, desired breakdown voltage characteristics can be achieved.

(1-2. Circuit Configuration of Differential Output Circuit Including Two Stages of Cascode Transistors)

Here, in order to explain the operation of differential output circuit 1 including n stages of cascode transistors according to Embodiment 1, an example will be given using differential output circuit 2 where n=2.

Figure 2A:
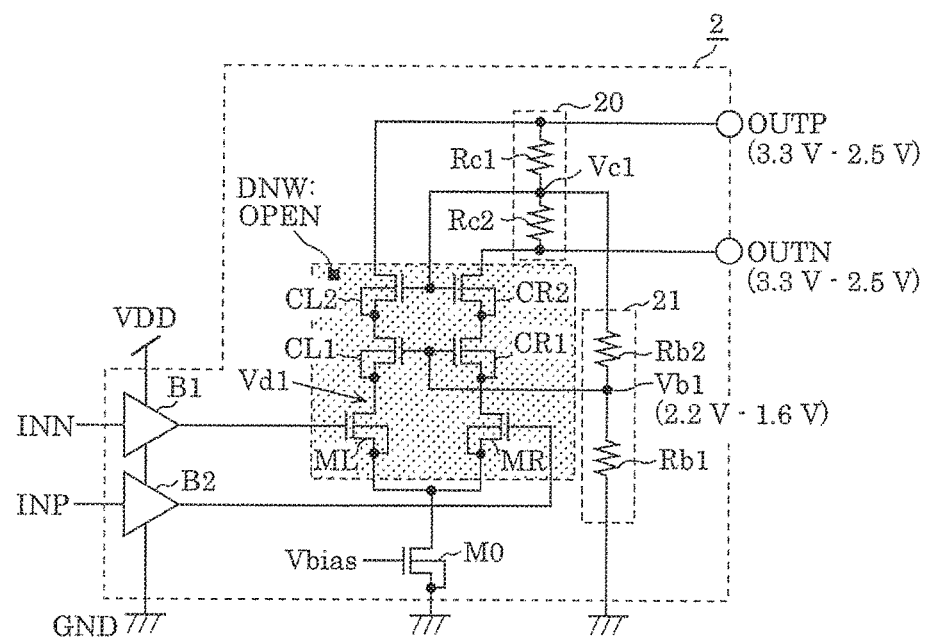
FIG. 2A illustrates a circuit configuration of a differential output circuit including two stages of cascode transistors according to Embodiment 1.

FIG. 2A illustrates the circuit configuration of differential output circuit 2 including two stages of cascode transistors according to Embodiment 1. In the same figure, differential output circuit 2 includes buffers B1 and B2, current source transistor M0, input transistors ML and MR, cascode transistors CL1 and CL2, cascode transistors CR1 and CR2, intermediate potential generating circuit 20, dividing circuit 21, and output terminals OUTP and OUTN.

The drain of cascode transistor CL2 is connected to output terminal OUTP, and the drain of cascode transistor CR2 is connected to output terminal OUTN.

Intermediate potential generating circuit 20 includes resistors Rc1 and Rc2, and resistors Rc1 and Rc2, which are connected in series, are connected between output terminals OUTP and OUTN. Moreover, a connection node of resistors Rc1 and Rc2 is connected to the gates of cascode transistors CL2 and CR2.

Dividing circuit 21 includes resistors Rb1 and Rb2 connected in series, and resistors Rb1 and Rb2 are connected between (i) the connection node of resistors Rc1 and Rc2 and (ii) a GND terminal. Moreover, the connection node of resistors Rb1 and Rb2 is connected to the gates of cascode transistors CL1 and CR1. With this configuration, dividing circuit 21 generates divided potential Vb1 by dividing intermediate potential Vc1, and applies divided potential Vb1 to the gates of cascode transistors CL1 and CR1.

According to this configuration, since the potential difference between each pair of terminals of each transistor (i.e., gate-to-source, gate-to-drain, drain-to-source, gate-to-substrate potential differences) can be set so as to not exceed the breakdown voltage of the transistor, it is possible configure a high-voltage circuit using low-voltage transistors.

For example, using HDMI (R) as an example, in differential output circuit 2 in FIG. 2A, output terminals OUTP and OUTN terminate at 3.3V. The output amplitude of each is 0.5V. In this case, one output terminal is 3.3V and the other output terminal is 2.8V. Accordingly, intermediate potential Vc1 is 3.05V. Moreover, divided potential Vb1 of intermediate potential Vc1 is set to approximately 2.3V due to the settings of resistor Rb1 and Rb2. Here, the drain potential Vd1 of input transistor ML is approximately 1.6 to 1.7V.

Thus, when intermediate potential Vc1=3.05V, the gate-to-drain voltage of cascode transistors CL2 and CR2 is 0.3V or less, and the gate-to-source voltage of cascode transistors CL2 and CR2 is about 0.7V. Moreover, when divided potential Vb1=2.3V, the gate-to-drain voltage of cascode transistors CL1 and CR1 is about 0.1V, and the gate-to-source voltage of cascode transistors CL1 and CR1 is about 0.8V. Thus, the terminal-to-terminal voltage of a low-voltage transistor (for example, Vp=1.9 to 2V) does not exceed the breakdown voltage of any of the transistors. Accordingly, with differential output circuit 2, it is possible to achieve high-voltage characteristics, high-speed characteristics, and low power consumption using low-voltage transistors.

Moreover, since low-voltage transistors are used for input transistor ML (MR) and cascode transistors CL1 (CR1) and CL2 (CR2), the amplitude of the signal input into input transistor MR (ML) can be reduced. In other words, a configuration can be used in which the potential of power supply voltage VDD for driving buffers B1 and B2 is lower than the potential of output terminals OUTP and OUTN. This makes it possible to reduce the power consumption of differential output circuit 2.

Note that a configuration having only one stage of cascode transistors is conceivable from the standpoint of ensuring high-voltage characteristics to some extent and realizing high-speed and low power consumption. However, in this case, the breakdown voltage characteristics of input transistor MR (ML) are determined by the characteristics of a single cascode transistor. In other words, it is not possible to meet, for example, flexible breakdown voltage specifications, high-speed specifications, and power consumption specifications associated with the performance requirements of the data communications system.

In light of this, differential output circuits 1 and 2 according to this embodiment include two or more stages of cascode transistors. In other words, since the number of cascode transistor stages themselves can be changed with little restriction, the breakdown voltage specifications, high-speed specifications, and power consumption specifications can be optimized.

(1-3. Semiconductor Structures in Differential Output Circuit Including Two Stages of Cascode Transistors)

Figure 2B:
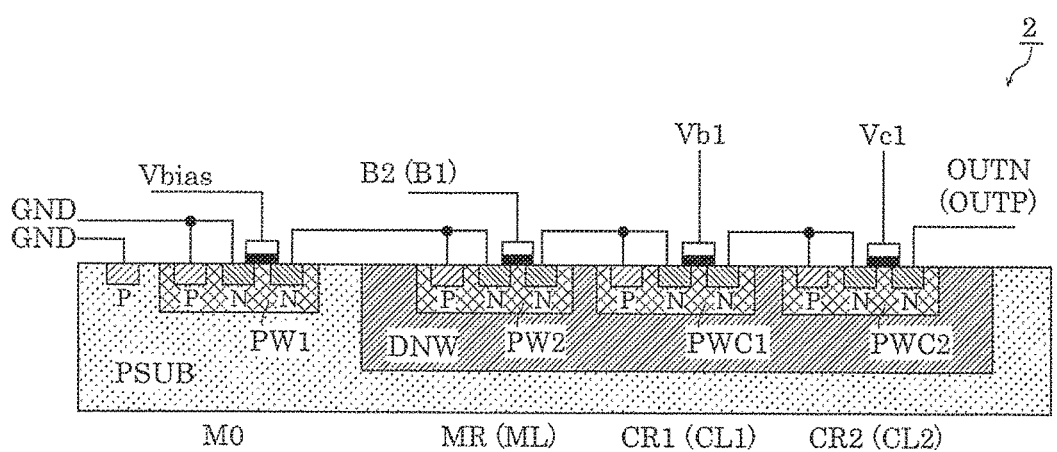
FIG. 2B illustrates a cross-sectional view of semiconductor structures in a differential output circuit including two stages of cascode transistors according to Embodiment 1.

Next, the semiconductor structures that form the above-described differential output circuit 2 will be described. FIG. 2B illustrates a cross-sectional view of semiconductor structures in differential output circuit 2 including two stages of cascode transistors according to Embodiment 1. In FIG. 2B, differential output circuit 2 includes a P-type substrate PSUB. P-type well PW1 and an N-type separation well DNW are formed in substrate PSUB.

N-type diffusion layers forming the source and drain of current source transistor M0 are formed in P-type well PW1, which serves as the back gate for current source transistor M0, and the gate electrode of current source transistor M0 is disposed on P-type well PW1, above the region between the two N-type diffusion layers.

P-type well PW2, which serves as the back gate for input transistor MR (ML), P-type well PWC1, which serves as the back gate for cascode transistor CR1 (CL1), and P-type well PWC2, which serves as the back gate for cascode transistor CR2 (CL2), are formed in separation well DNW.

N-type diffusion layers forming the source and drain of input transistor MR (ML) are formed in P-type well PW2, and the gate electrode of input transistor MR (ML) is disposed on P-type well PW2, above the region between the two N-type diffusion layers.

N-type diffusion layers forming the source and drain of cascode transistor CR1 (CL1) are formed in P-type well PWC1, and the gate electrode of cascode transistor CR1 (CL1) is disposed on P-type well PWC1, above the region between the two N-type diffusion layers.

N-type diffusion layers forming the source and drain of cascode transistor CR2 (CL2) are formed in P-type well PWC2, and the gate electrode of cascode transistor CR2 (CL2) is disposed on P-type well PWC2, above the region between the two N-type diffusion layers.

Here, the potentials of P-type wells PW2, PWC1, and PWC2 disposed below the diffusion layers of input transistor MR (ML) and cascode transistors CR1 (CL1) and CR2 (CL2) are supplied from the source potentials of the respective transistors. In other words, P-type wells PW2, PWC1, and PWC2 are separated from each other.

If this is applied to differential output circuit 1 including n stages of cascode transistors, a k-th first P-type well supplied with the source potential of the k-th stage first cascode transistor CLk (1≤k≤n) is formed below the diffusion regions of first cascode transistor CLk. Moreover, a k-th second P-type well supplied with the source potential of the k-th stage second cascode transistor CRk (1≤k≤n) is formed below the diffusion regions of the k-th stage second cascode transistor CRk. All of the first through n-th first P-type wells are separated from each other, and all of the first through n-th second P-type wells are separated from each other.

Moreover, separation well DNW may be floating. Moreover, input transistor MR (ML) and cascode transistors CR1 (CL1) and CR2 (CL2) may share a common separation well DNW. With this, the potential of the separation well DNW is determined according to a parasitic diode in the forward direction of the separation well DNW from the above described P-type well, but since the potential (0V) of substrate PSUB is higher than the potential of separation well DNW, it is possible to prevent through current to substrate PSUB. Moreover, when the P-type well potential is less than or equal to the separation well DNW potential, the current that flows from P-type well PWC2 to separation well DNW is substantially zero, making it possible to ensure favorable circuitry characteristics and high reliability.

(1-4. Circuit Configuration of and Semiconductor Structures in Differential Output Circuit According to Variation)

Figure 3A:
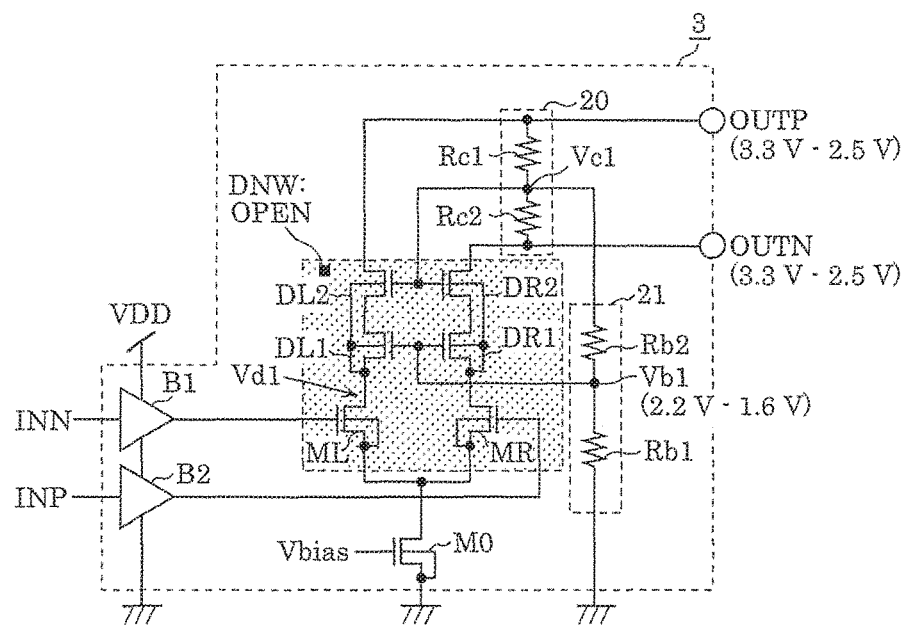
FIG. 3A illustrates a circuit configuration of a differential output circuit including two stages of cascode transistors according to a variation of Embodiment 1.

FIG. 3A illustrates the circuit configuration of differential output circuit 3 including two stages of cascode transistors according to a variation of Embodiment 1. In the same figure, differential output circuit 3 includes buffers B1 and B2, current source transistor M0, input transistors ML and MR, cascode transistors DL1 and DL2, cascode transistors DR1 and DR2, intermediate potential generating circuit 20, dividing circuit 21, and output terminals OUTP and OUTN.

Differential output circuit 3 according to this variation differs from differential output circuit 2 according to Embodiment 1 in regard to the connection configuration of the back gates of cascode transistors DL2 and DR2, that is to say, the potential supply configuration of the back gates of cascode transistors DL2 and DR2. Hereinafter, description of common configurations with differential output circuit 2 according to Embodiment 1 is omitted; the description will focus on the configurations that are different.

As illustrated in FIG. 3A, the back gate of cascode transistor DL2 is connected to the back gate and source of cascode transistor DL1 rather than the source of cascode transistor DL2. Similarly, the back gate of cascode transistor DR2 is connected to the back gate and source of cascode transistor DR1 rather than the source of cascode transistor DR2.

A connection configuration such as the one in this variation is achievable when the potential difference between the source potential of cascode transistor DL1 and the drain potential of cascode transistor DL2 is set lower than the breakdown voltage of each transistor.

(1-5. Semiconductor Structures in Differential Output Circuit According to Variation)

Figure 3B:
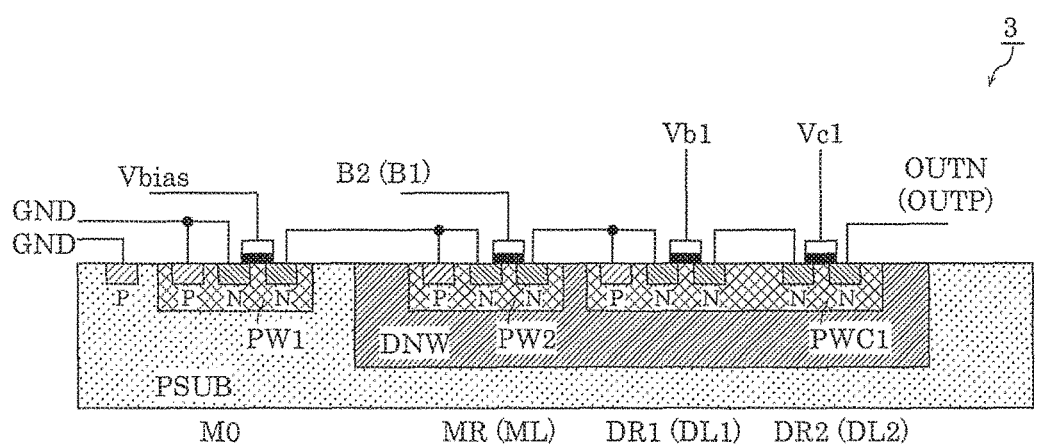
FIG. 3B illustrates a cross-sectional view of semiconductor structures in a differential output circuit including two stages of cascode transistors according to a variation of Embodiment 1.

FIG. 3B illustrates a cross-sectional view of semiconductor structures in differential output circuit 3 including two stages of cascode transistors according to a variation of Embodiment 1. In FIG. 3B, differential output circuit 3 includes a P-type substrate PSUB. P-type well PW1 and an N-type separation well DNW are formed in substrate PSUB.

P-type well PW2, which serves as the back gate for input transistor MR (ML), and P-type well PWC1, which serves as the back gates for cascode transistors DR1 (DL1) and DR2 (DL2), are formed in separation well DNW.

N-type diffusion layers forming the source and drain of cascode transistor DR1 (DL1) are formed in P-type well PWC1, and the gate electrode of cascode transistor DR1 (DL1) is disposed on P-type well PWC1, above the region between the two N-type diffusion layers. Similarly, N-type diffusion layers forming the source and drain of cascode transistor DR2 (DL2) are formed in P-type well PWC1, and the gate electrode of cascode transistor DR2 (DL2) is disposed on P-type well PWC1, above the region between the two N-type diffusion layers. In other words, the P-type well formed below the N-type diffusion layers of cascode transistor DR1 (DL1) and the P-type well formed below the N-type diffusion layers of cascode transistor DR2 (DL2) are configured as single continuous P-type well PWC1.

With this configuration, the source potential of cascode transistor DR1 (DL1) is supplied to the P-type well formed below the diffusion regions of cascode transistor DR2 (DL2).

This makes it possible to reduce the surface area of the circuit since the number of separations in the P-type wells is reduced.

Embodiment 2

In this embodiment, divided potential applied to the gate of a cascode transistor is variable depending on the operational state of the differential output circuit.

(2-1. Circuit Configuration of Differential Output Circuit Including Two Stages of Cascode Transistors)

Figures 4A, 4B:
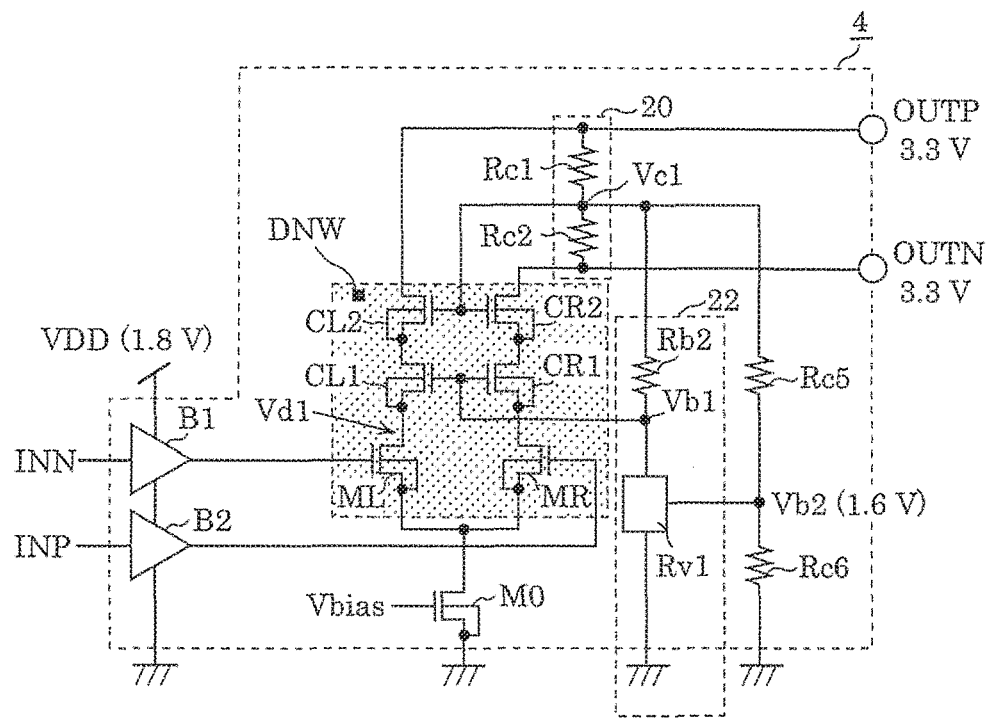
FIG. 4A illustrates a circuit configuration of a differential output circuit including two stages of cascode transistors according to Embodiment 2.
FIG. 4B illustrates a circuit configuration of a variable resistance unit according to Embodiment 2.

FIG. 4A illustrates the circuit configuration of differential output circuit 4 including two stages of cascode transistors according to Embodiment 2. In the same figure, differential output circuit 4 includes buffers B1 and B2, current source transistor M0, input transistors ML and MR, cascode transistors CL1, CL2, CR1 and CR2, intermediate potential generating circuit 20, variable dividing circuit 22, and output terminals OUTP and OUTN.

Differential output circuit 4 according to this embodiment differs from differential output circuit 3 according to Embodiment 1 in regard to the configuration of variable dividing circuit 22. Hereinafter, description of common configurations with differential output circuit 3 according to Embodiment 1 is omitted; the description will focus on the configurations that are different.

Variable dividing circuit 22 includes variable resistance unit Rv1 and Rb2 connected in series, and variable resistance unit Rv1 and resistor Rb2 are connected between (i) the connection node of resistors Rc1 and Rc2 and (ii) a GND terminal. Moreover, the connection node of variable resistance unit Rv1 and resistor Rb2 is connected to the gates of cascode transistors CL1 and CR1. With this configuration, variable dividing circuit 22 generates divided potential Vb1 by dividing intermediate potential Vc1 in accordance with the operational state of differential output circuit 4, and applies divided potential Vb1 to the gates of cascode transistors CL1 and CR1.

When the differential output circuit is powered down, for example, output terminals OUTP and OUTN are terminated at 3.3V, and in order to prevent through current from flowing from output terminals OUTP and OUTN toward GND in the differential output circuit, the gate potentials of current source transistor M0 and input transistors ML and MR need to be fixed in a pull-down state. In this case, there is a possibility that a voltage that exceeds the transistor breakdown voltage may be applied between the gates and drains of input transistors ML and MR (for example, 1.9 to 2V).

Moreover, in a state in which power supply voltage VDD is not being supplied to the differential output circuit, there is a possibility that output terminals OUTP and OUTN will terminate at 3.3V. Since the gate potential of input transistors ML and MR is pulled-down to 0V or enters a high-impedance (Hi-z) state, there is a possibility in this case as well that a voltage that exceeds the transistor breakdown voltage may be applied between the gates and drains of input transistors ML and MR.

Even in these states described above, namely a powered-down state and a state in which power supply voltage VDD is not being supplied, with differential output circuit 4 according to this embodiment, a voltage that exceeds the transistor breakdown voltage is not applied between the gates and drains of input transistors ML and MR. Hereinafter, variable resistance unit Rv, which is a relevant component in differential output circuit 4 according to this embodiment, will be described in detail.

FIG. 4B illustrates the circuit configuration of variable resistance unit Rv according to Embodiment 2. Variable resistance unit Rv illustrated in this figure includes resistors Rb70 and Rb71, transistors M71 and M72, controller 50, and power supply voltage detector 41a. Power supply voltage detector 41a is a circuit that detects whether power supply voltage VDD is being supplied or not, and includes resistors RL1 and RL2.

In the above-described configuration, divided potential Vb1 is determined by the resistance ratio between variable resistance unit Rv1 and resistor Rb2.

FIG. 4C is a state transmission diagram of variable resistance unit Rv according to Embodiment 2.

First, when power supply voltage VDD is supplied (VDD=1.8V) and the differential output circuit is in a powered-down state (NPD=L) (state A), controller 50 outputs an H level (Vb2) control signal to the gate of transistor M71. Here, both transistors M71 and M72 are in a conducting state, and variable resistance unit Rv assumes a series-parallel combined resistance of Rb70 and 71. With this, divided potential Vb1 is a low potential.

Next, when power supply voltage VDD is supplied (VDD=1.8V) and the differential output circuit is in a powered-on state (NPD=H) (state B), controller 50 outputs an L level control signal to the gate of transistor M71. Here, transistor M71 is in a non-conducting state, and variable resistance unit Rv is Rb70. With this, divided potential Vb1 is a normal potential.

Next, when power supply voltage VDD is not supplied (VDD=0V) and the differential output circuit is in a powered-down state (NPD=L) (state C), controller 50 outputs an H level (Vb2) control signal to the gate of transistor M71. Here, both transistors M71 and M72 are in a conducting state, and variable resistance unit Rv assumes a series-parallel combined resistance of Rb70 and 71. With this, divided potential Vb1 is a low potential.

Next, when power supply voltage VDD is not supplied (VDD=0V) and the differential output circuit is in a powered-on state (NPD=H) (state D), controller 50 outputs an H level (Vb2) control signal to the gate of transistor M71. Here, both transistors M71 and M72 are in a conducting state, and variable resistance unit Rv assumes a series-parallel combined resistance of Rb70 and 71. With this, divided potential Vb1 is a low potential.

When differential output circuit 4 is in a powered-down state (state A or C), output terminals OUTP and OUTN are in a state in which they terminate at, for example, 3.3V, and intermediate potential Vc1 is 3.3V. The gate potentials of current source transistor M0 transistor and input transistors ML and MR are fixed in a pull-down state. Here, similar to in differential output circuit 2 according to Embodiment 1, so long as Vb1=2.3V, the source potential of cascode transistors CL1 and CR1 is about 2.0V. Accordingly, there is a possibility that a voltage that exceeds the transistor breakdown voltage may be applied between the gates and drains of input transistors ML and MR (for example, 1.9 to 2V). In contrast, with differential output circuit 4 according to this embodiment, when differential output circuit 4 is in a powered-down state, divided potential Vb1 is a low potential (Vb1=approximately 1.7V). Accordingly, the voltage between the gates and drains of input transistors ML and MR is controlled so as not to exceed the transistor breakdown voltage.

Moreover, in a state in which power supply voltage VDD is not being supplied to differential output circuit 4 (state C or D), there is also a possibility here that output terminals OUTP and OUTN will terminate at 3.3V. In these cases as well, the gate potentials of input transistors ML and MR are pulled-down to 0V or enter a high-impedance (Hi-z) state Here as well, divided potential Vb1 is a low potential (Vb1=approximately 1.7V). Accordingly, the voltage between the gates and drains of input transistors ML and MR is controlled so as not to exceed the transistor breakdown voltage.

Note that when differential output circuit 4 operates, input transistors ML and MR are preferably caused to operate in saturated areas. Divided potential Vb1 is preferably set so as to fulfill this.

As described above, with differential output circuit 4 according to this embodiment, it is possible to achieve high-voltage characteristics, high-speed characteristics, and low power consumption using low-voltage transistors, and it is possible to vary the divided potential applied to the gate of a cascode transistor in accordance with the operating state of differential output circuit 4. This makes it possible to control the voltages applied to the transistors so as not to exceed the transistor breakdown voltage, even if the operating state of differential output circuit 4 changes.

Note that in the circuit configuration of variable resistance unit Rv, transistors 71 and 72 are cascode connected between resistor Rb71 and a GND terminal. With this configuration, even when 0V is applied to the gate of transistor M71 and divided potential Vb1 is set higher than or equal to the transistor breakdown voltage, the gate-to-drain potential of transistor M72 can be prevented from exceeding the breakdown voltage.

Note that the configuration of the power supply voltage detector is not limited to the configuration of power supply voltage detector 41a illustrated in FIG. 4B.

FIG. 4D illustrates the configuration of power supply voltage detector 41b according to Variation 1 of Embodiment 2. As illustrated in FIG. 4D, transistor ML2 that is shorted between its gate and drain may be used instead of resistor RL1 in power supply voltage detector 41a.

FIG. 4E illustrates the configuration of power supply voltage detector 41c according to Variation 2 of Embodiment 2. As illustrated in FIG. 4E, in power supply voltage detector 41c, a transistor that is shorted between its gate and drain and is connected in series to resistor RL2 may be configured in a plurality of stages, like transistors ML1 and ML2.

Moreover, the intermediate potential generating circuit is not limited to the configuration of intermediate potential generating circuit 20 illustrated in FIG. 4B.

Figure 4F:
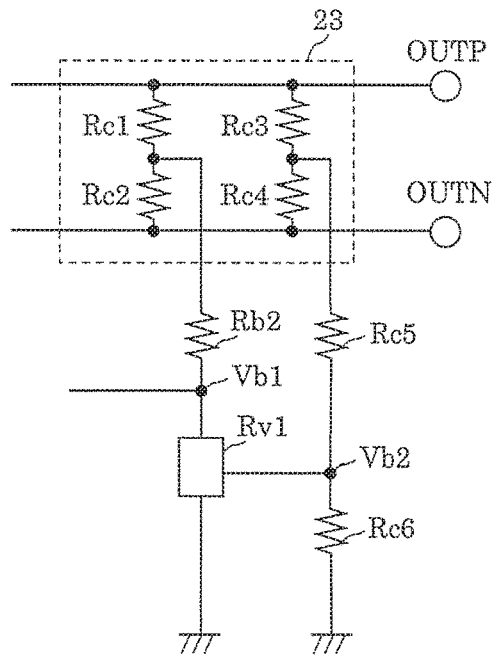
FIG. 4F illustrates a configuration of an intermediate potential generating circuit according to Variation 3 of Embodiment 2.

FIG. 4F illustrates the configuration of intermediate potential generating circuit 23 according to Variation 3 of Embodiment 2. As illustrated in FIG. 4F, a configuration in which the circuit for generating divided potential Vb2 and the circuit including resistors Rc1 and Rc2 for generating divided potential Vb1 are separated.

Moreover, in this embodiment, the circuit configuration of and operations performed by differential output circuit 4 including two stages of cascode transistors was described, but the design concept of the present embodiment is not limited to a differential output circuit including two stages of cascode transistors. The design concept of the present embodiment is also applicable to divided potentials Vb1 through Vb (n−1) supplied to the gates of cascode transistors included in a differential output circuit including n stages of cascode transistors.

Embodiment 3

In this embodiment, the cascode transistor back gate connectivity in a differential output circuit including n stages of cascode transistors will be described.

(3-1. Circuit Configuration of Differential Output Circuit Including n Stages of Cascode Transistors)

Figure 5A:
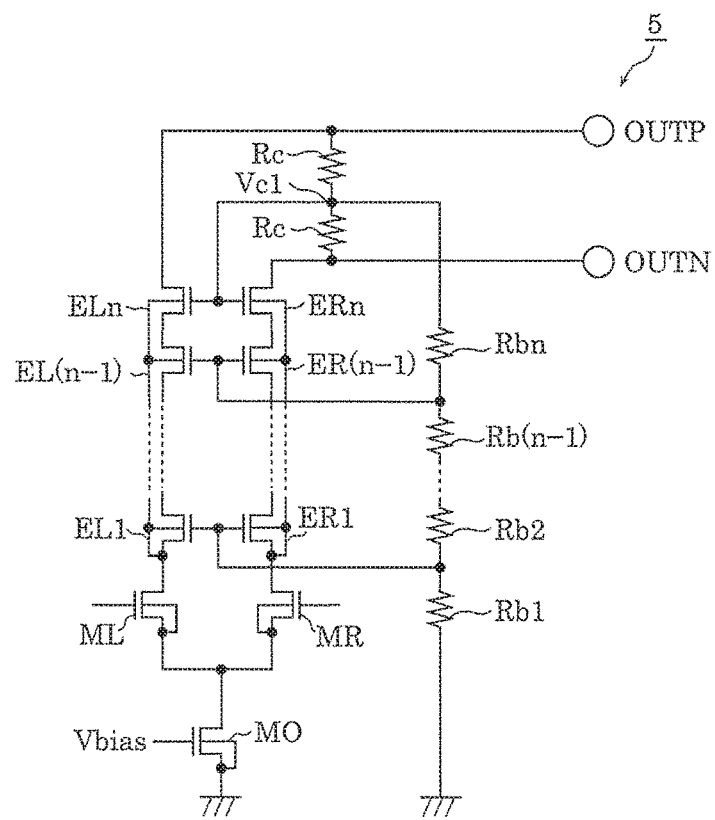
FIG. 5A illustrates a circuit configuration of a differential output circuit including n stages of cascode transistors according to Embodiment 3.

FIG. 5A illustrates the circuit configuration of differential output circuit 5 including n stages of cascode transistors according to Embodiment 3. In the same figure, differential output circuit 5 includes current source transistor M0, input transistors ML and MR, n cascode transistors EL1 through ELn, and n cascode transistors ER1 through ERn.

Differential output circuit 5 according to this embodiment differs from differential output circuit 1 according to Embodiment 1 in regard to the connection configuration of the back gates of the cascode transistors, that is to say, the potential supply configuration of the back gates of the cascode transistors. Hereinafter, description of common configurations with differential output circuit 1 according to Embodiment 1 is omitted; the description will focus on the configurations that are different.

As illustrated in FIG. 5A, the back gate of the k-th stage ($1 \leq k \leq n$) first cascode transistor ELk is commonly supplied with the source potential of the first stage first cascode transistor EL1. Moreover, the back gate of the k-th stage ($1 \leq k \leq n$) first cascode transistor ERk is commonly supplied with the source potential of the first stage first cascode transistor ER1.

(3-2. Semiconductor Structures in Differential Output Circuit Including n Stages of Cascode Transistors)

Figure 5B:
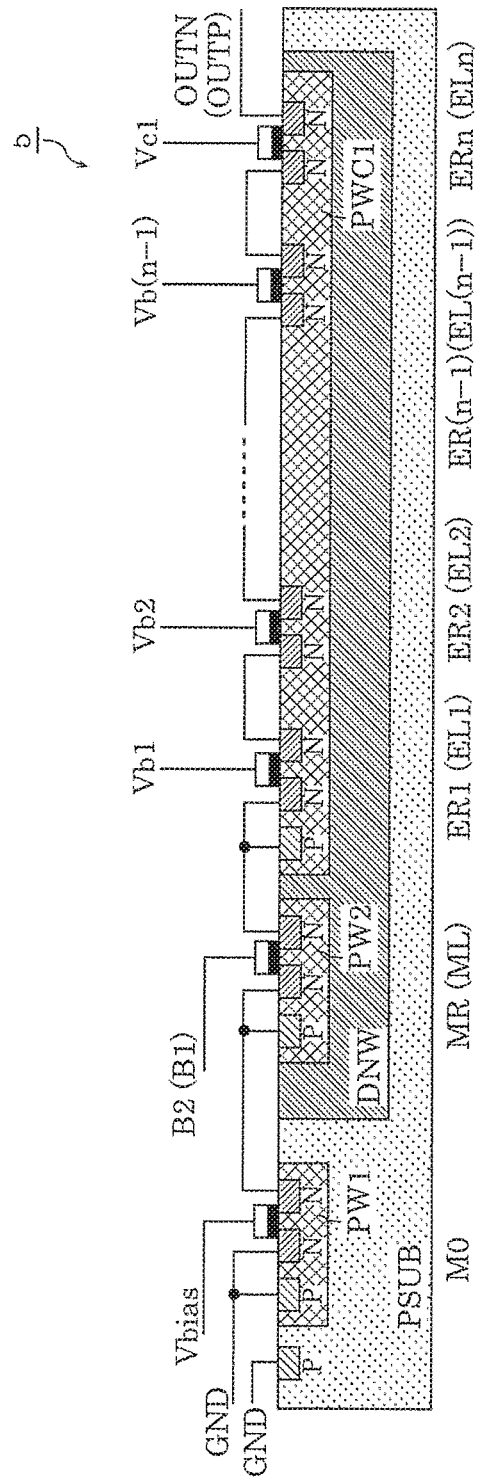
FIG. 5B illustrates a cross-sectional view of semiconductor structures in a differential output circuit including n stages of cascode transistors according to Embodiment 3.

FIG. 5B illustrates a cross-sectional view of semiconductor structures in differential output circuit 5 including n stages of cascode transistors according to Embodiment 3. As illustrated in FIG. 5B, a common P-type well PWC1 supplied with the source potential of cascode transistor ER1 (EL1) is formed below and shared by the N-type diffusion layers of the first through n-th stages of the cascode transistors.

With this configuration, since it is not necessary to individually supply respective cascode transistor P-wells with source potential, it is possible to reduce the size of the circuit.

(3-3. Circuit Configuration of Differential Output Circuit According to Variation)

Figure 6A:
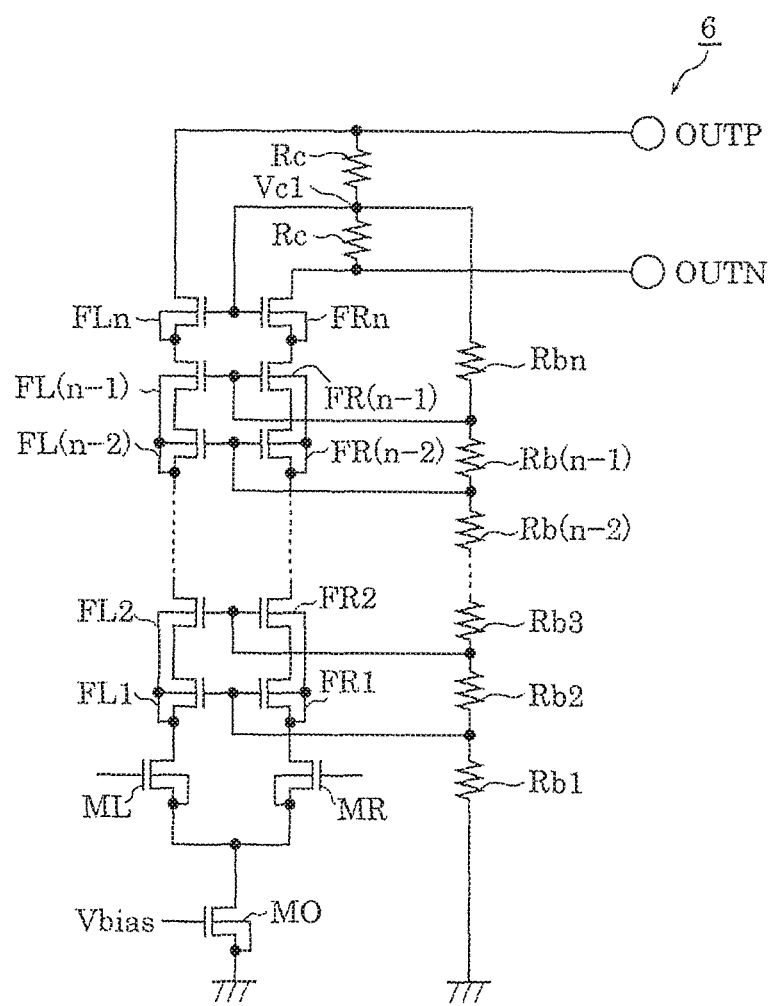
FIG. 6A illustrates a circuit configuration of a differential output circuit including n stages of cascode transistors according to a variation of Embodiment 3.

FIG. 6A illustrates the circuit configuration of differential output circuit 6 including n stages of cascode transistors according to a variation of Embodiment 3. In the same figure, differential output circuit 6 includes current source transistor M0, input transistors ML and MR, n cascode transistors FL1 through FLn, and n cascode transistors FR1 through FRn.

Differential output circuit 6 according to this embodiment differs from differential output circuit 5 according to Embodiment 3 in regard to the connection configuration of the back gates of the cascode transistors, that is to say, the potential supply configuration of the back gates of the cascode transistors. Hereinafter, description of common configurations with differential output circuit 5 according to Embodiment 3 is omitted; the description will focus on the configurations that are different.

As illustrated in FIG. 6A, the back gate of the k-th stage (even number satisfying $2 \leq k \leq n$) first cascode transistor FLk is supplied with the source potential of the (k−1)-th stage first cascode transistor FL(k−1). Moreover, the back gate of the k-th stage (even number satisfying $2 \leq k \leq n$) second cascode transistor FRk is supplied with the source potential of the (k−1)-th stage second cascode transistor FR(k−1).

(3-4. Semiconductor Structures in Differential Output Circuit According to Variation)

Figure 6B:
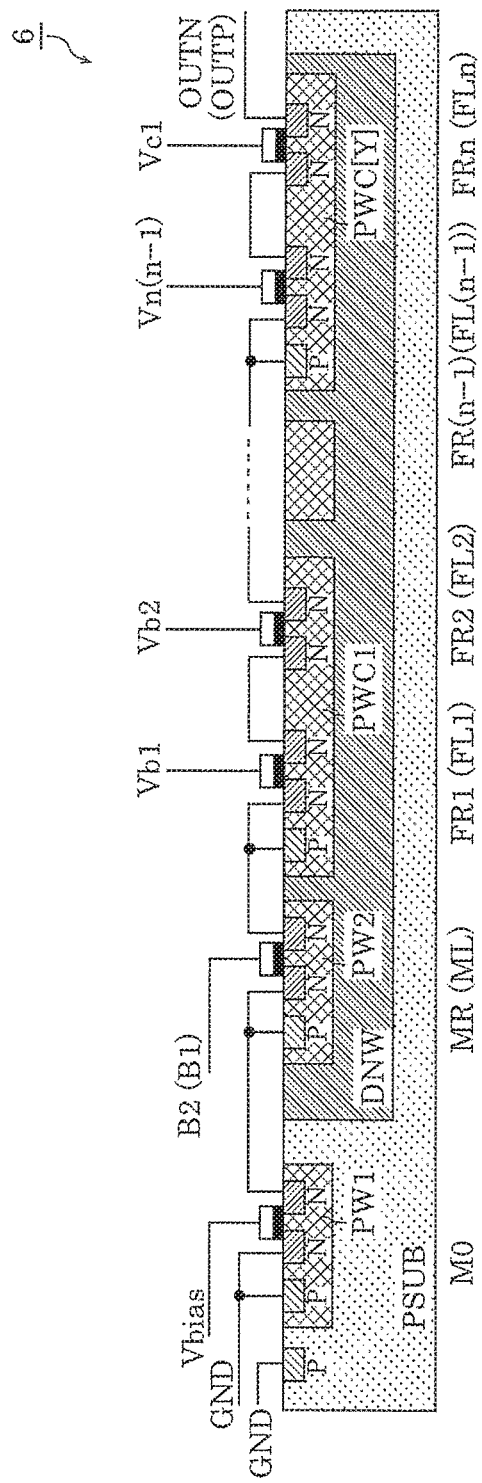
FIG. 6B illustrates a cross-sectional view of semiconductor structures in a differential output circuit including n stages of cascode transistors according to a variation of Embodiment 3.

FIG. 6B illustrates a cross-sectional view of semiconductor structures in differential output circuit 6 including n stages of cascode transistors according to a variation of Embodiment 3. As illustrated in FIG. 6B, a common P-type well PWC(k−1) supplied with the source potentials of (k−1)-th stage cascode transistors is formed below and shared by the N-type diffusion layers of the (k−1)-th through k-th stages (k is an even number satisfying $2 \leq k \leq n$) of the cascode transistors.

With this configuration, since it is not necessary to individually supply respective cascode transistor P-wells with source potential, it is possible to reduce the size of the circuit.

Here, the maximum number Y that can share the potential of a P-type well disposed below the N-type diffusion layers of the cascode transistors is expressed in Equation 2 below, where X is the minimum number of P-well separations.

$$Y = n/X \qquad \text{(Equation 2)}$$

Note that Y is a value obtained by truncating the decimals of the value calculated from Equation 2. Moreover, the minimum number of P-well separations X is expressed in Equation 3 below.

$$X = (V_{OUTP} - Vd1)Vp \qquad \text{(Equation 3)}$$

In other words, the minimum number of separations X is a value obtained by dividing the potential difference between the drain potential $V_{OUTP}$ of the n-th stage first cascode transistor FLn and a source potential Vd1 of the first stage first cascode transistor FL1 by a transistor breakdown voltage Vp (X being a natural number less than or equal to n; decimals of X are rounded up to a next natural number).

Here, a W-th (W being a natural number in a range of from 1 to X) common first P-type well supplied with a source potential of the [(W−1)×(Y+1)]-th stage of the first cascode transistors is formed below the N-type diffusion layers of the [W×Y]-th through [(W−1)×(Y+1)]-th stages of the first cascode transistors.

Moreover, a W-th (W being a natural number in a range of from 1 to X) common second P-type well supplied with a source potential of the [(W−1)×(Y+1)]-th stage of the second cascode transistors is formed below the N-type diffusion layers of the [W×Y]-th through [(W−1)×(Y+1)]-th stages of the second cascode transistors.

For example, assume that the drain potential VN of the n-th stage first cascode transistor FLn is 3.6V, the source potential VI of the first stage first cascode transistor FL1 is 1.5V, and the transistor breakdown voltage is 0.9V.

Here, the required number of stages n of the cascode transistors is n=3, X=3, and Y=1 according to Equation 3. In other words, when n=3, the potential of the P-type well of a cascode transistor is the supplied source potential of that cascode transistor.

Note that the "breakdown voltage" may be the actual breakdown voltage of the transistor, or may be a value having a margin around the actual breakdown voltage.

(Conclusion)

As described above with reference to the drawings, the differential output circuit according to this embodiment includes: input transistors ML and MR that receive respective differential input signals having mutually inverted phases; n stages of cascode transistors connected to input transistors ML and MR; output terminals OUTP and OUTN connected to respective n-th stage cascode transistors; intermediate potential generating circuit 10 that supplies intermediate potential Vc1 of the potential of output terminal OUTP and the potential of output terminal OUTN to the gates of the n-th stage cascode transistors; and dividing circuit 11 that supplies divided potentials resulting from intermediate potential Vc1 being divided into (n−1) states to respective gates of (n−1)-th through first stages of the first cascode transistors in descending order of potential.

With this, it is possible to configure a high-voltage differential output circuit that uses low-voltage transistors, without the potential difference between the terminals of each transistor (gate-to-source voltage, gate-to-drain voltage, drain-to-source voltage, gate-to-substrate voltage) exceeding the transistor threshold voltage.

Moreover, the potentials of the P-type wells below the N-type diffusion layers of the n stages of cascode transistors may be the supplied source potentials of the cascode transistors.

With this, it is possible to configure a high-voltage differential output circuit.

Moreover, so long as the potential difference between the terminals of each transistor does not exceed the breakdown voltage, the potentials of the P-type wells below the N-type diffusion layers of the n stages of cascode transistors may be shared among P-type wells of a plurality of cascode transistors.

This makes it possible to reduce the surface area of the semiconductor circuitry.

Moreover, the dividing circuit may include an adjusting mechanism that adjusts the divided potentials to optimal values when power supply voltage is not supplied to differential output circuit or when differential output circuit is powered-down.

This makes it possible to control the voltages applied to the transistors so as not to exceed the transistor breakdown voltage, even if the operating state of the differential output circuit changes.

(Other Embodiments)

Hereinbefore, differential output circuits according to embodiments of the present disclosure have been described, but the present disclose is not limited to Embodiments 1 through 3.

For example, in Embodiments 1 through 3, the separation well DNW is a common well shared by input transistors ML and MR and the n stages of cascode transistors. The differential output circuit according to the present invention is not limited to this example; the separation well DNW may be separated.

Figure 7:
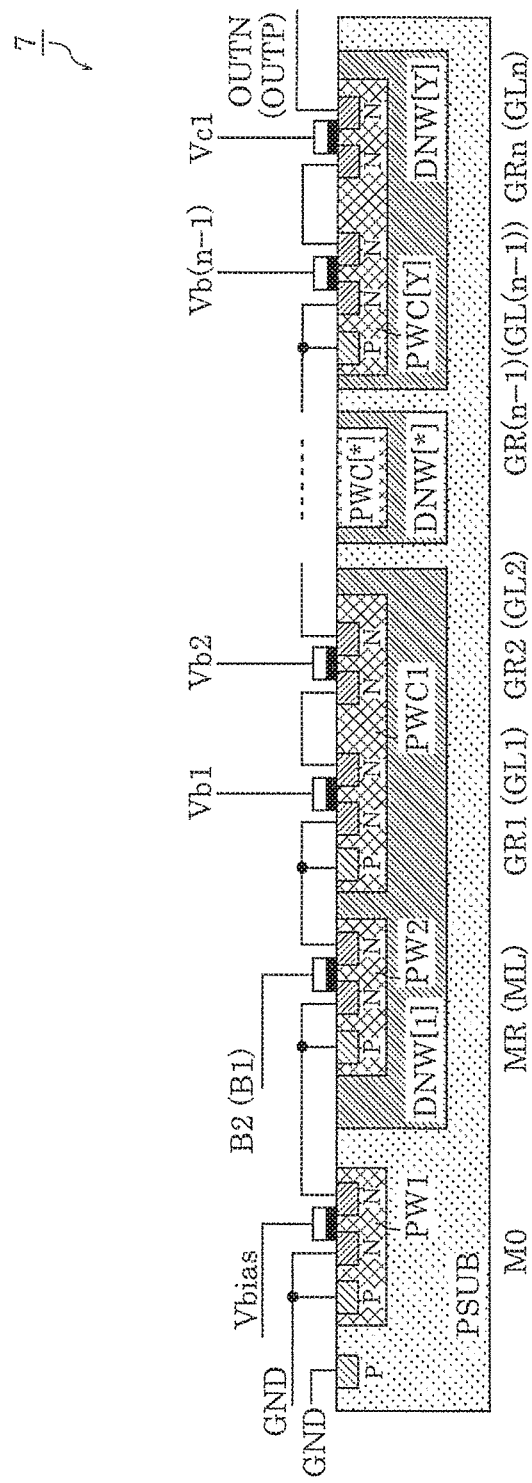
FIG. 7 illustrates a cross-sectional view of semiconductor structures in a differential output circuit including n stages of cascode transistors according to a variation.

FIG. 7 illustrates a cross-sectional view of semiconductor structures in differential output circuit 7 including n stages of cascode transistors GR1 (GL1) through GRn (GLn) according to a variation. As illustrated in the same figure, Y number of separation wells DNW[1] through DNW[Y] are formed in differential output circuit 7. For example, when the breakdown voltage between the separation well DNW and the P-type well may become problematic in different semiconductor processes, appropriately separating the separation well DNW, as illustrated in FIG. 7, is effective.

Moreover, controller 50 according to Embodiment 3 may typically be configured as an LSI circuit, which is an integrated circuit. Each processing unit of controller 50 may be realized as an individual chip. One chip may include some or all of the processing units.

Moreover, the integrated circuit is not limited to an LSI circuit, and may be realized as a dedicated circuit or general purpose processor. A field programmable gate array (FPGA) that is programmable after manufacturing of the LSI circuit, or a reconfigurable processor whose connections and settings regarding circuit cells in the LSI circuit are reconfigurable, may be used.

Moreover, in Embodiment 2, a configuration for adjusting the divided potentials is exemplified as variable resistance unit Rv including resistors, but differential output circuit 4 according to Embodiment 2 may include a configuration that changes the current of variable resistance unit Rv without the use of resistors, or a configuration that variably changes the divided potentials under some sort of control other than resistors.

Moreover, all of the values used above are mere examples given for the purpose of illustrating specific examples of the present disclosure. Accordingly, the present disclosure is not limited to these exemplary values. Further, logic levels expressed as H level and L level are mere examples given for the purpose of illustrating specific examples of the present disclosure. The same results may be achievable via combinations of logic levels different from those exemplified above.

Moreover, the materials of the elements given above are mere examples given for the purpose of illustrating specific examples of the present disclosure. Accordingly, the present disclosure is not limited to these exemplary materials. Moreover, the connective relationships between the elements given above are mere examples given for the purpose of illustrating specific examples of the present disclosure. Accordingly, the connective relationships that achieve the functions of the present disclosure are not limited to these examples.

Moreover, various modifications of the following embodiments that may be conceived by those skilled in the art are intended to be included within the scope of the present disclosure as long as they do not depart from the essence of the present disclosure.

INDUSTRIAL APPLICABILITY

The present invention can be used in circuits to realize high-voltage characteristics using low-voltage transistors in applications that require high output terminal voltage, regardless of the data transmission driver.

The invention claimed is:

1. A differential output circuit, comprising:
a first input transistor and a second input transistor that receive respective differential input signals, the respective differential input signals having mutually inverted phases; and
n stages of first cascode transistors (n being a natural number greater than or equal to 2) connected in cascade manner to the first input transistor and n stages of second cascode transistors connected in cascade manner to the second input transistor,
wherein when the first cascode transistor connected to a drain of the first input transistor is a first stage first cascode transistor, the first cascode transistor connected farthest from the first input transistor is an n-th stage first cascode transistor, the second cascode transistor connected to a drain of the second input transistor is a first stage second cascode transistor, and the second cascode transistor connected farthest from the second input transistor is an n-th stage second cascode transistor, with respect to each of the n stages, a gate of a k-th stage of the first cascode transistors ($1 \le k \le n$) and a gate of a k-th stage of the second cascode transistors are connected, and
the differential output circuit further comprises:
a first output terminal connected to a drain of the n-th stage first cascode transistor;
a second output terminal connected to a drain of the n-th stage second cascode transistor;
an intermediate potential generating circuit that supplies an intermediate potential of a potential of the first output terminal and a potential of the second output terminal to a gate of the n-th stage first cascode transistor and a gate of the n-th stage second cascode transistor;
a dividing circuit that supplies divided potentials resulting from the intermediate potential being divided into (n−1) stages to respective gates of (n−1)-th through first stages of the first cascode transistors in descending order of potential, and
a potential supplied to back gates of the first input transistor and the second input transistor is different from a potential supplied to back gates of at least one of the first cascode transistors other than the first stage first cascode transistor and at least one of the second cascode transistors other than the first stage second cascode transistor.

2. The differential output circuit according to claim 1, further comprising:
a first buffer and a second buffer that receive input signals and output the respective differential input signals to the first input transistor and the second input transistor,
wherein power supply voltage for driving the first buffer and the second buffer has a potential that is lower than the potentials of the first output terminal and the second output terminal.

3. The differential output circuit according to claim 1,
wherein the first input transistor, the second input transistor, the n stages of first cascode transistors, and the n stages of second cascode transistors are N-type MOS transistors,
the differential output circuit further comprises a P-type substrate,
the substrate includes diffusion regions forming sources and drains of each of the first input transistor, the second input transistor, the n stages of first cascode transistors, and the n stages of second cascode transistors, and
a potential separation N-well that is floating is formed below the diffusion regions of the first input transistor, the second input transistor, the n stages of first cascode transistors, and the n stages of second cascode transistors.

4. The differential output circuit according to claim 1,
wherein the first input transistor, the second input transistor, the n stages of first cascode transistors, and the n stages of second cascode transistors are N-type MOS transistors,
the differential output circuit further comprises a P-type substrate,
the substrate includes diffusion regions forming sources and drains of each of the first input transistor, the second input transistor, the n stages of first cascode transistors, and the n stages of second cascode transistors,
a P-type well supplied with source potentials of the first input transistor and the second input transistor is formed below the diffusion regions of the first input transistor and the second input transistor,
a k-th first P-type well supplied with a source potential of the k-th stage of the first cascode transistors ($1 \le k \le n$) is formed below the diffusion regions of the k-th stage of the first cascode transistors,
a k-th second P-type well supplied with a source potential of the k-th stage of the second cascode transistors ($1 \le k \le n$) is formed below the diffusion regions of the k-th stage of the second cascode transistors,
first through n-th ones of the first P-type wells are all separated from each other, and
first through n-th ones of the second P-type wells are all separated from each other.

5. The differential output circuit according to claim 1,
wherein the first input transistor, the second input transistor, the n stages of first cascode transistors, and the n stages of second cascode transistors are N-type MOS transistors,
the differential output circuit further comprises a P-type substrate,
the substrate includes diffusion regions forming sources and drains of each of the first input transistor, the second input transistor, the n stages of first cascode transistors, and the n stages of second cascode transistors,
a P-type well supplied with source potentials of the first input transistor and the second input transistor is formed below the diffusion regions of the first input transistor and the second input transistor,
when a value obtained by dividing a potential difference between a drain potential of the n-th stage first cascode transistor and a source potential of the first stage first cascode transistor by a transistor breakdown voltage is expressed as X (X being a natural number less than or equal to n; decimals of X are rounded up to a next natural number),
the P-type well below the diffusion regions of the first input transistor and the second input transistor is shared among at least Y=n/X stages of cascode transistors (Y being a natural number less than or equal to n; decimals of Y are truncated),
a W-th (W being a natural number in a range of from 1 to X) first P-type well supplied with a source potential of a [(W−1)×(Y+1)]-th stage of the first cascode transistors is formed below the diffusion regions of [W×Y]-th through [(W−1)×(Y+1)]-th stages of the first cascode transistors, and a W-th (W being a natural number in a range of from 1 to X) second P-type well supplied with a source potential of a [(W−1)×(Y+1)]-th stage of the second cascode transistors is formed below the diffusion regions of [W×Y]-th through [(W−1)×(Y+1)]-th stages of the second cascode transistors.

6. The differential output circuit according to claim 1, wherein the dividing circuit includes:
a power supply voltage detector that detects a power supply voltage for driving a first buffer and a second buffer that receive input signals and output the respective differential input signals to the first input transistor and the second input transistor; and
a variable resistance unit configured to adjust the divided potentials supplied to gates of the first cascode transistors and the second cascode transistors, when the power supply voltage detector detects that the power supply voltage is not being supplied or when the differential output circuit is powered-down.

7. A differential output circuit, comprising:
a first input transistor and a second input transistor that receive respective differential input signals, the respective differential input signals having mutually inverted phases; and
n stages of first cascode transistors (n being a natural number greater than or equal to 2) cascode connected to the first input transistor and n stages of second cascode transistors cascode connected to the second input transistor,
wherein when the first cascode transistor connected to a drain of the first input transistor is a first stage first cascode transistor, the first cascode transistor connected farthest from the first input transistor is an n-th stage first cascode transistor, the second cascode transistor connected to a drain of the second input transistor is a first stage second cascode transistor, and the second cascode transistor connected farthest from the second input transistor is an n-th stage second cascode transistor, with respect to each of the n stages, a gate of a k-th stage of the first cascode transistors (1≤k≤n) and a gate of a k-th stage of the second cascode transistors are connected, and
the differential output circuit further comprises:
a first output terminal connected to a drain of the n-th stage first cascode transistor;
a second output terminal connected to a drain of the n-th stage second cascode transistor;
an intermediate potential generating circuit that supplies an intermediate potential of a potential of the first output terminal and a potential of the second output terminal to a gate of the n-th stage first cascode transistor and a gate of the n-th stage second cascode transistor; and
a dividing circuit that supplies divided potentials resulting from the intermediate potential being divided into (n−1) stages to respective gates of (n−1)-th through first stages of the first cascode transistors in descending order of potential, and
wherein the first input transistor, the second input transistor, the n stages of first cascode transistors, and the n stages of second cascode transistors are N-type MOS transistors,
the differential output circuit further comprises a P-type substrate, the substrate includes diffusion regions forming sources and drains of each of the first input transistor, the second input transistor, the n stages of first cascode transistors, and the n stages of second cascode transistors, and
a potential separation N-well that is floating is formed below the diffusion regions of the first input transistor, the second input transistor, the n stages of first cascode transistors, and the n stages of second cascode transistors.

8. A differential output circuit, comprising:
a first input transistor and a second input transistor that receive respective differential input signals, the respective differential input signals having mutually inverted phases; and
n stages of first cascode transistors (n being a natural number greater than or equal to 2) cascode connected to the first input transistor and n stages of second cascode transistors cascode connected to the second input transistor,
wherein when the first cascode transistor connected to a drain of the first input transistor is a first stage first cascode transistor, the first cascode transistor connected farthest from the first input transistor is an n-th stage first cascode transistor, the second cascode transistor connected to a drain of the second input transistor is a first stage second cascode transistor, and the second cascode transistor connected farthest from the second input transistor is an n-th stage second cascode transistor, with respect to each of the n stages, a gate of a k-th stage of the first cascode transistors (1≤k≤n) and a gate of a k-th stage of the second cascode transistors are connected, and
the differential output circuit further comprises:
a first output terminal connected to a drain of the n-th stage first cascode transistor;
a second output terminal connected to a drain of the n-th stage second cascode transistor;
an intermediate potential generating circuit that supplies an intermediate potential of a potential of the first output terminal and a potential of the second output terminal to a gate of the n-th stage first cascode transistor and a gate of the n-th stage second cascode transistor; and
a dividing circuit that supplies divided potentials resulting from the intermediate potential being divided into (n−1) stages to respective gates of (n−1)-th through first stages of the first cascode transistors in descending order of potential, and
wherein the first input transistor, the second input transistor, the n stages of first cascode transistors, and the n stages of second cascode transistors are N-type MOS transistors,
the differential output circuit further comprises a P-type substrate,
the substrate includes diffusion regions forming sources and drains of each of the first input transistor, the second input transistor, the n stages of first cascode transistors, and the n stages of second cascode transistors,
a P-type well supplied with source potentials of the first input transistor and the second input transistor is formed below the diffusion regions of the first input transistor and the second input transistor,
a k-th first P-type well supplied with a source potential of the k-th stage of the first cascode transistors (1≤k≤n) is formed below the diffusion regions of the k-th stage of the first cascode transistors, a k-th second P-type well supplied with a source potential of the k-th stage of the second cascode transistors (1≤k≤n) is formed below the diffusion regions of the k-th stage of the second cascode transistors, first through n-th ones of the first P-type wells are all separated from each other, and first through n-th ones of the second P-type wells are all separated from each other.

9. A differential output circuit, comprising:
a first input transistor and a second input transistor that receive respective differential input signals, the respective differential input signals having mutually inverted phases; and
n stages of first cascode transistors (n being a natural number greater than or equal to 2) cascode connected to the first input transistor and n stages of second cascode transistors cascode connected to the second input transistor,
wherein when the first cascode transistor connected to a drain of the first input transistor is a first stage first cascode transistor, the first cascode transistor connected farthest from the first input transistor is an n-th stage first cascode transistor, the second cascode transistor connected to a drain of the second input transistor is a first stage second cascode transistor, and the second cascode transistor connected farthest from the second input transistor is an n-th stage second cascode transistor, with respect to each of the n stages, a gate of a k-th stage of the first cascode transistors (1≤k≤n) and a gate of a k-th stage of the second cascode transistors are connected, and
the differential output circuit further comprises:
a first output terminal connected to a drain of the n-th stage first cascode transistor;
a second output terminal connected to a drain of the n-th stage second cascode transistor;
an intermediate potential generating circuit that supplies an intermediate potential of a potential of the first output terminal and a potential of the second output terminal to a gate of the n-th stage first cascode transistor and a gate of the n-th stage second cascode transistor; and
a dividing circuit that supplies divided potentials resulting from the intermediate potential being divided into (n−1) stages to respective gates of (n−1)-th through first stages of the first cascode transistors in descending order of potential, and
wherein the first input transistor, the second input transistor, the n stages of first cascode transistors, and the n stages of second cascode transistors are N-type MOS transistors,
the differential output circuit further comprises a P-type substrate,
the substrate includes diffusion regions forming sources and drains of each of the first input transistor, the second input transistor, the n stages of first cascode transistors, and the n stages of second cascode transistors,
a P-type well supplied with source potentials of the first input transistor and the second input transistor is formed below the diffusion regions of the first input transistor and the second input transistor,
when a value obtained by dividing a potential difference between a drain potential of the n-th stage first cascode transistor and a source potential of the first stage first cascode transistor by a transistor breakdown voltage is expressed as X (X being a natural number less than or equal to n; decimals of X are rounded up to a next natural number), the P-type well below the diffusion regions of the first input transistor and the second input transistor is shared among at least Y=n/X stages of cascode transistors (Y being a natural number less than or equal to n; decimals of Y are truncated), a W-th (W being a natural number in a range of from 1 to X) first P-type well supplied with a source potential of a [(W−1)×(Y+1)]-th stage of the first cascode transistors is formed below the diffusion regions of [W×Y]-th through [(W−1)×(Y+1)]-th stages of the first cascode transistors, and a W-th (W being a natural number in a range of from 1 to X) second P-type well supplied with a source potential of a [(W−1)×(Y+1)]-th stage of the second cascode transistors is formed below the diffusion regions of [W×Y]-th through [(W−1)×(Y+1)]-th stages of the second cascode transistors.

10. A differential output circuit, comprising:
a first input transistor and a second input transistor that receive respective differential input signals, the respective differential input signals having mutually inverted phases; and
n stages of first cascode transistors (n being a natural number greater than or equal to 2) cascode connected to the first input transistor and n stages of second cascode transistors cascode connected to the second input transistor,
wherein when the first cascode transistor connected to a drain of the first input transistor is a first stage first cascode transistor, the first cascode transistor connected farthest from the first input transistor is an n-th stage first cascode transistor, the second cascode transistor connected to a drain of the second input transistor is a first stage second cascode transistor, and the second cascode transistor connected farthest from the second input transistor is an n-th stage second cascode transistor, with respect to each of the n stages, a gate of a k-th stage of the first cascode transistors (1≤k≤n) and a gate of a k-th stage of the second cascode transistors are connected, and
the differential output circuit further comprises:
a first output terminal connected to a drain of the n-th stage first cascode transistor;
a second output terminal connected to a drain of the n-th stage second cascode transistor;
an intermediate potential generating circuit that supplies an intermediate potential of a potential of the first output terminal and a potential of the second output terminal to a gate of the n-th stage first cascode transistor and a gate of the n-th stage second cascode transistor; and
a dividing circuit that supplies divided potentials resulting from the intermediate potential being divided into (n−1) stages to respective gates of (n−1)-th through first stages of the first cascode transistors in descending order of potential, and
wherein the dividing circuit includes:
a power supply voltage detector that detects a power supply voltage for driving a first buffer and a second buffer that receive input signals and output the respective differential input signals to the first input transistor and the second input transistor; and a variable resistance unit configured to adjust the divided potentials supplied to gates of the first cascode transistors and the second cascode transistors, when the power supply voltage detector detects that the power supply voltage is not being supplied or when the differential output circuit is powered-down.

* * * * *